United States Patent
Ball

(10) Patent No.: US 9,832,915 B2
(45) Date of Patent: Nov. 28, 2017

(54) PRESSURE LOCKING BOARD LEVEL SHIELD ASSEMBLIES

(71) Applicant: Laird Technologies, Inc., Earth City, MO (US)

(72) Inventor: Shelby Ball, Friso, TX (US)

(73) Assignee: Laird Technologies, Inc., Earth City, MO (US)

( * ) Notice: Subject to any disclaimer, the term of this patent is extended or adjusted under 35 U.S.C. 154(b) by 0 days.

(21) Appl. No.: 15/401,833

(22) Filed: Jan. 9, 2017

(65) Prior Publication Data

US 2017/0231123 A1    Aug. 10, 2017

Related U.S. Application Data

(60) Provisional application No. 62/292,107, filed on Feb. 5, 2016.

(51) Int. Cl.
*H05K 9/00*    (2006.01)

(52) U.S. Cl.
CPC ......... *H05K 9/0032* (2013.01); *H05K 9/0037* (2013.01); *H05K 9/0081* (2013.01)

(58) Field of Classification Search
CPC ... H05K 9/0032; H05K 9/0037; H05K 9/0081
USPC ...................... 361/799, 816, 818; 174/35, 50
See application file for complete search history.

(56) References Cited

U.S. PATENT DOCUMENTS

| 4,952,752 | A | * | 8/1990 | Roun | H05K 9/0016 174/353 |
| 5,095,177 | A | * | 3/1992 | Johnson | H04B 1/034 174/372 |
| 5,278,351 | A | * | 1/1994 | Herrick | H05K 5/0013 174/372 |
| 6,137,694 | A | * | 10/2000 | Kerrigan | G06F 1/182 361/816 |
| 6,177,631 | B1 | * | 1/2001 | Schindler | H02B 1/30 174/50 |
| 7,488,902 | B2 | | 2/2009 | English et al. | |
| 7,491,899 | B2 | * | 2/2009 | Zuehlsdorf | H04B 1/40 174/372 |
| 7,916,500 | B2 | * | 3/2011 | Shi | H05K 5/0013 174/350 |
| 9,609,763 | B2 | * | 3/2017 | Gerst | H05K 5/0013 |
| 2013/0033843 | A1 | | 2/2013 | Crotty, Jr. | |

* cited by examiner

*Primary Examiner* — Hung S Bui
(74) *Attorney, Agent, or Firm* — Harness, Dickey & Pierce, P.L.C.

(57) ABSTRACT

According to various aspects, exemplary embodiments are disclosed of board level shields. In an exemplary embodiment, a board level shield (BLS) includes a fence and a lid. The fence is solderable to a printed circuit board (PCB). When the lid is engaged to the fence that has been soldered to the PCB, the BLS provides substantial electromagnetic interference (EMI) shielding protection to the components covered by the BLS. The lid may be constructed of a frame and a cover. The cover may be a film or foil. The lid may attach to the fence via a one way directional latching mechanism, which may be enhanced by the use of one or more interior downward tabs on the lid that meet one or more inward protrusions from the fence to create pressure on the lid and fence.

18 Claims, 6 Drawing Sheets

PRESSURE LOCKING BOARD LEVEL SHIELD ASSEMBLIES

CROSS-REFERENCE TO RELATED APPLICATION

This application claims priority to and the benefit of U.S. Provisional Patent Application No. 62/292,107 filed Feb. 5, 2016. The entire disclosure of the above application is incorporated herein by reference.

FIELD

The present disclosure relates, generally, to board level shield (BLS) assemblies for electromagnetic interference mitigation.

BACKGROUND

This section provides background information related to the present disclosure which is not necessarily prior art.

Electromagnetic interference (EMI) shielding is an important aspect of electronic device manufacture and function. EMI may cause undesirable performance or failure of electronic components in an electronic device. EMI shielding may be achieved by a variety of manners, including through the use of a metallic board level shield (BLS). Such shields may be solderable to printed circuit boards (PCBs), and some are two-piece shields that include solderable walls and a lid that is attachable thereto. A BLS may thusly enclose electrical components on the PCB and provide EMI mitigation or elimination. In certain applications, it may be desirable to have additional materials on the underside of the BLS, including the underside of the BLS lid when a two-piece shield is used.

One type of BLS is the two-piece shield, which includes a fence and a lid, where the fence is mounted on a PCB and the lid fits over the frame to complete the enclosure. A variety of mechanisms are known to enable secure, and sometimes removable, attachment of the lid to the fence. In some applications, it is desirable to have a snug, secure attachment of the lid to the fence.

SUMMARY

This section provides a general summary of the disclosure, and is not a comprehensive disclosure of its full scope or all of its features.

Embodiments of a board level shield (BLS) for electromagnetic interference mitigation are disclosed. The BLS includes a fence and a lid. The fence may be soldered to a PCB around the perimeter of one or more electrical components on the PCB to be shielded. The lid may be configured to attach to the fence, whereby the assembled BLS provides substantial EMI shielding to the desired specifications of the installer. The lid may itself include a frame and a layer of film or foil. The frame may be a perimeter of material complementary in size and shape to the fence. The film or foil may be adhered to the frame to form a complete lid, such that full EMI performance may be enjoyed to a substantial degree as if the lid was a single piece of material.

The lid may be affixed to the fence via a unique attachment mechanism, specifically two or more attachment mechanisms working in unison to provide a snug, substantially secure attachment of the lid to the fence. In an exemplary embodiment, the attachment mechanism includes latching of the lid to the fence via a one way locking tab and perforation arrangement, and further by the application of pressure between a tab of the lid against the fence.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

As noted above, electronic circuits or components of a PCB are often enclosed with shields to localize EMI within its source, and to insulate other devices proximal to the EMI source. One known way to form these shields is by stamping a piece of material using, for example, a die stamping process to form an enclosure, and then folding side portions of the stamped piece of material downward, generally perpendicularly to form side walls. The shield may then be installed to the PCB to enclose the desired electronic circuits or components.

In exemplary embodiments, a board level shield is disclosed that is solderable to a PCB. Where a BLS intends to protect the electrical components on the PCB, a fence and a two-piece lid (or foil or film cover and frame) arrangement may be used. The fence may comprise a perimeter of vertical metal (or other electrically-conductive material) with respect to a horizontal planar PCB. The fence includes a substantially flush bottom that meets the PCB for soldering. The lid may be generally complementary in shape to the fence, such that the lid may be placed over the fence (e.g., to cover an open top defined by the fence, etc.) to create a substantially complete barrier to EMI. A snug fit between the lid and the fence provides enhanced shielding and conductivity.

In various applications, materials may be included on the underside of the lid, such that when the lid is placed on a fence that has been soldered to the PCB, the materials on the underside of the lid may interact with or protect the electronic components covered by the shield. In some applications, a thermal interface material (TIM) may be included on or along the underside of the lid and may come into direct contact with one or more electronic components. In other applications, the thermal interface material may be an absorber.

Disclosed herein are exemplary embodiments of board level shields that include a fence and a lid, or a fence and frame and foil or film (e.g., metal foil, reinforced foil, electrically-conductive film, metallized or metal plated polyimide film, etc.) cover. Advantageously, using foil or film for the BLS cover may reduce the weight of the BLS and/or increase the available Z-height or under-shield space thereby providing a customer more design space under the film or foil. By saving weight, the cost per unit can be reduced, and the overall weight of the electronic device can be similarly reduced. By saving height, the overall thickness of the electronic device may be reduced and/or there is more space for additional components within the electronic device.

Figure 1:
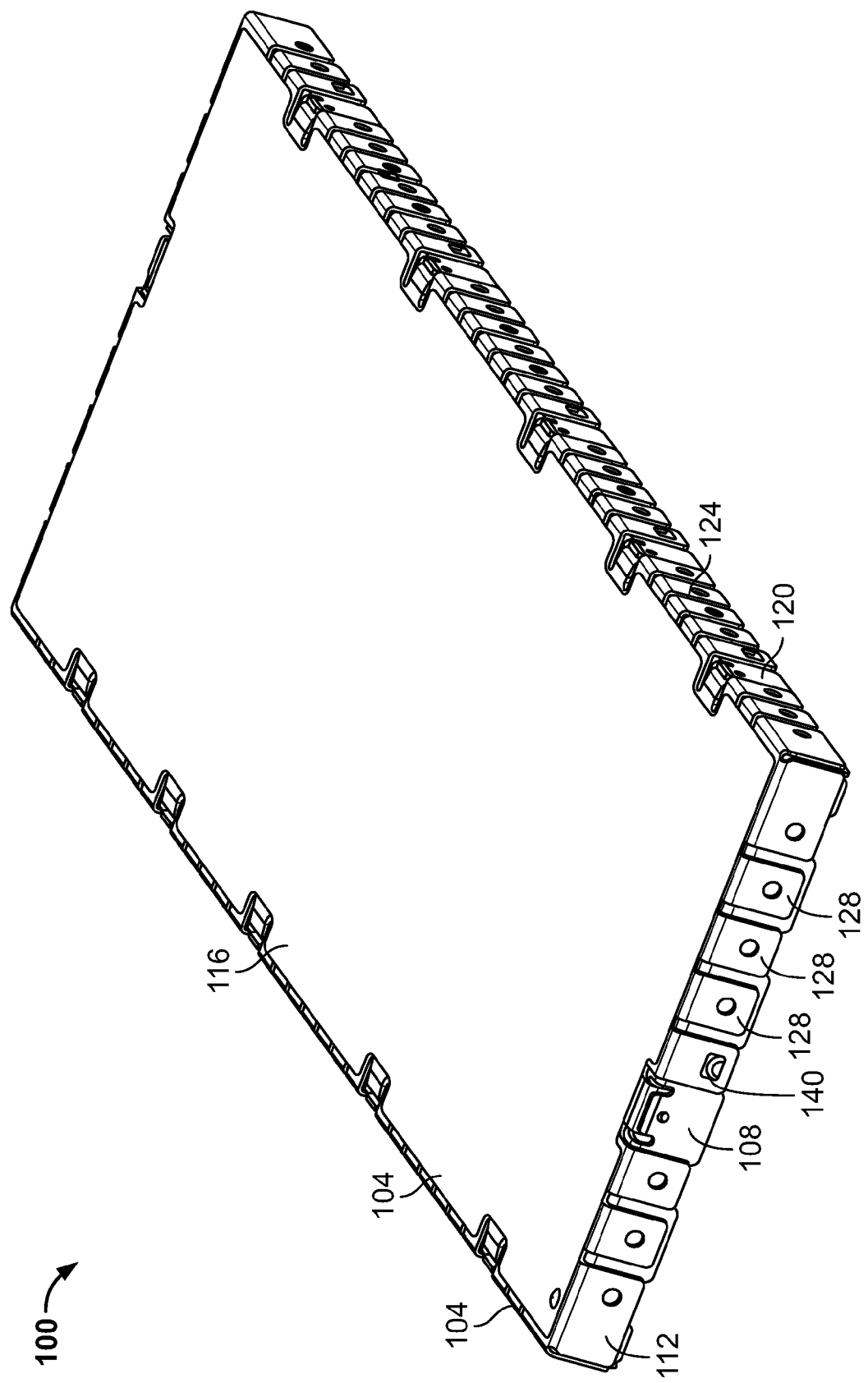
FIG. 1 is an elevated perspective view of an embodiment of a board level shield (BLS) of the disclosure, this embodiment showing a lid mounted on a fence, where the lid includes a frame and a film or foil layer adhered to the top of the frame.

Turning to the figures, FIG. 1 shows an embodiment of the board level shield (BLS) 100 of the disclosure. In this particular embodiment, the BLS 100 includes both a lid 104 and a fence or frame 108. The lid 104 includes a frame 112 (or sidewalls) and a cover 116. Here, the lid 104 has been mated onto the fence 108 as a fully-assembled BLS 100. The fence 108 includes four sidewalls 120. The frame 112 of the lid 104 also includes four sidewalls 124. In this instance, the lid's sidewalls 124 are defined by a series of downwardly-protruding tabs 128 from the horizontal plane of the cover 116 and top of the frame 112. The sidewalls 124 of the lid 104 substantially enclose the fence 108 to provide the EMI shielding desired for the components protected by the BLS 100. The lid's frame 112 includes a perimeter rim or flange 132 extending inwardly from the top of the sidewalls 124. The rim 132 is substantially perpendicular to the sidewalls 124. The fence 108 includes a perimeter of preferably solderable material that is substantially vertical with respect to a horizontal PCB plane. The fence 108 may optionally further include a perimeter lip, flange, or rim extending inwardly from and substantially perpendicular to the top of the vertical solderable material.

The cover 116 of the lid assembly 104 is attached to the frame's perimeter rim 132 in this exemplary embodiment. The cover 116 may extend over the outer perimeter edges of the lid 104 and downwardly over some or all of the sidewalls 124 of the lid's frame 112. The attachment of the cover 116 should be substantially complete to encompass the entirety of the opening defined by the inner edges of the frame's rim 132, so as to provide substantially complete EMI shielding. Gaps in the cover-to-frame attachment can allow the entrance and/or escape of undesirable EMI. The cover 116 may be attached with bonded adhesive, soldering, laser welding, or mechanical fastening, as non-limiting examples. The cover 116 may be constructed of metal foil, reinforced foil, electrically-conductive film, metallized or metal plated polyimide film, as non-limiting examples.

Figure 2:
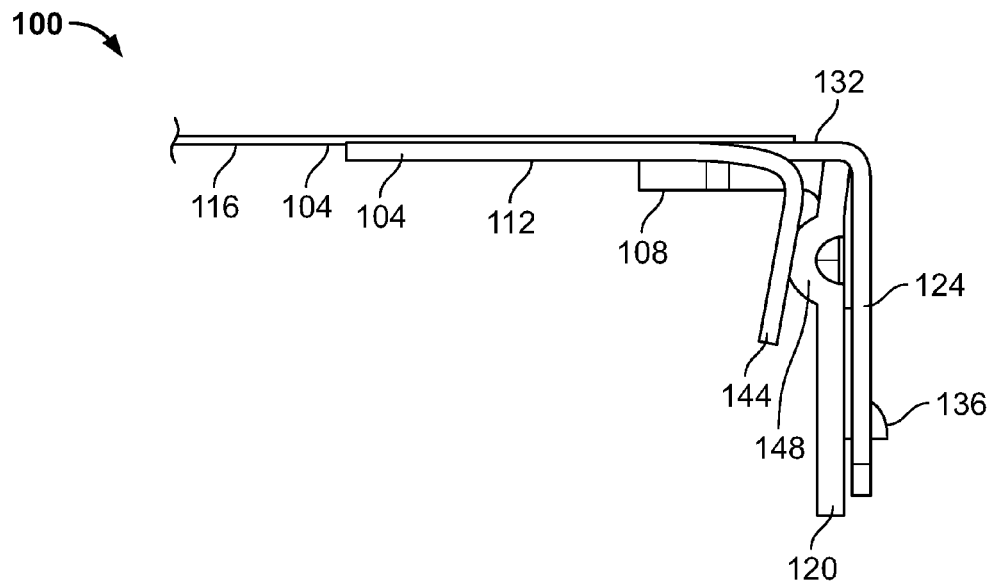
FIG. 2 is a partial cross-sectional view of the BLS shown in FIG. 1, this figure showing details of embodiments of the pressure and locking mechanisms of the lid and fence.

Turning now to FIG. 2, a cross-sectional region of the BLS 100 is seen. As shown in FIG. 2, the lid 104 having been affixed to the fence 108. The lid 104 includes the frame 128 and the cover 116. The frame 128 includes the rim 132 and descending sidewalls 124 that cover a portion of the outside of the fence 108 when the BLS 100 is fully assembled with the lid 104 coupled to the fence 108.

In this exemplary embodiment, the sidewalls 120 and 124 of the respective fence 108 and lid 104 together include one way directional latching features. Removable latching features are embraced by this disclosure, in addition to the one way locking seen in FIG. 2, for example. In this embodiment, the vertical fence sidewall 120 includes detents or protrusions 136 (e.g., protruding quarter spherical or sphere-like shapes, etc.) that may engage a complementary aperture 140 on the frame sidewall 124, or on a corresponding downward tab 128 of the frame sidewall 124. As downward pressure is applied during BLS installation, the bottom edge of the lid frame sidewall 124 slides down and over the fence curvature protrusion 136 and the protrusion 136 meets and occupies the frame aperture 140. The frame 112 will eventually snap inwardly towards the fence 108 along an edge of the aperture 140 to complete the one way directional locking mechanism.

Further looking to FIG. 2, the lid frame 112 additionally includes one or more interior tabs 144. The interior tabs 144 are downward protrusions of frame sidewall 124 set back some distance towards the interior of the lid 104. The interior tabs 144 are perpendicular to the remainder of the frame sidewalls 124 prior to installation of the lid 104 onto the fence 108. The result can be seen in FIG. 2, where the lid 104 has been nested onto the fence 108. Here a portion of the frame sidewall 124 can be seen on the outside of the fence 108 after having been engaged in a one directional locking mechanism. Additionally, an interior tab 144 of the frame 112 rests within the perimeter of the fence 108. In this exemplary embodiment, the fence 108 includes a dimple-like inward protrusion 148 (broadly, a detent or protrusion) along the fence sidewall 120. This inward protrusion 148 forces the interior tab 144 to at least partially bend inward, thereby providing pressure against the lid frame 112 and thereby tightening the frame sidewall 124 against the fence 108. This positive pressure may allow for better electrical contact between the lid 104 and the fence 108. This tightening, in combination with the directional latching mechanism, improves not only the secure attachment of the lid 104 to the fence 108, but also creates a tight seal between the lid 104 and the fence 108, thereby enhancing the conductivity of the BLS 100 and further restricting the EMI shielding properties of the BLS 100.

Figure 3:
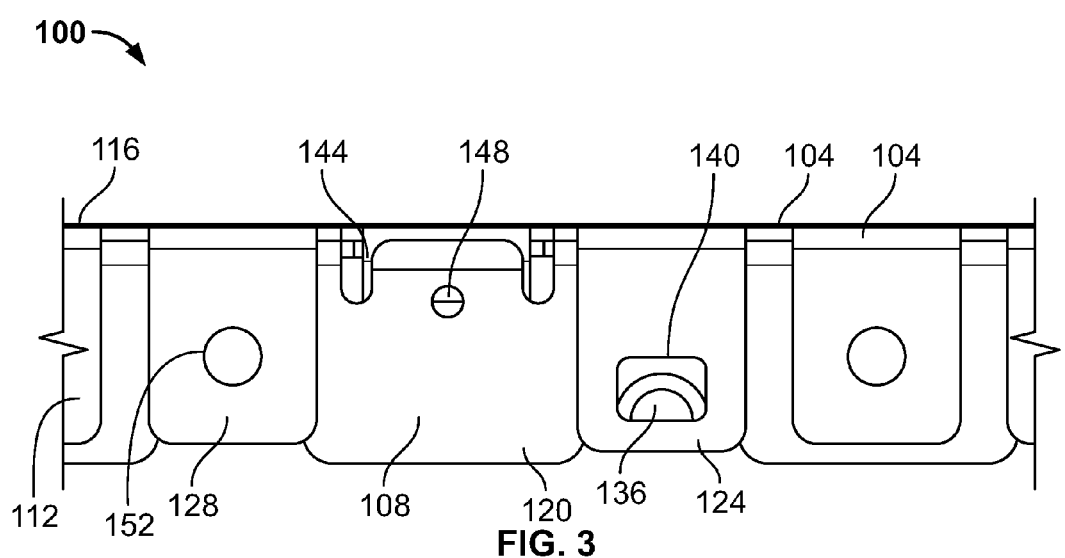
FIG. 3 is a partial side view of the BLS shown in FIG. 1, this figure showing details of the embodiments of the pressure and locking mechanisms of the lid and fence as seen in FIG. 2.

FIG. 3 shows a portion of an assembled BLS 100 as seen in FIGS. 1 and 2 and some detail of the attachment mechanisms described above. Accordingly, the one way directional locking mechanism can be seen, specifically the embodiment of the protruding quarter sphere-like shape 136 that is engageable within a complementary aperture 140 on the frame sidewall 124. The aperture 140 in this figure is substantially rectangular to accept the protrusion 136. The interior tab 144 of the frame is also shown, the tab resting within the perimeter of the fence 108. The dimple-like inward protrusion 148 of the fence sidewall can be seen from the exterior of the BLS 100, aligned with the interior tab 144 of the lid frame 112. In this exemplary embodiment, the pressure and locking features of the BLS 100 are relatively close to one another. The relative proximity of these features enhances the strength of the pressure effect on the locking mechanism. The lid frame 112, as seen in this figure, may optionally include a series of circular holes 152 and/or tabs 128 that define the lid frame sidewalls 124. The circular holes may aid in the tooling and shaping of the frame 112, among other purposes. Complete, non-tabbed, lid frame sidewalls between the interior tabs 148 are fully embraced by this disclosure.

Figure 4:
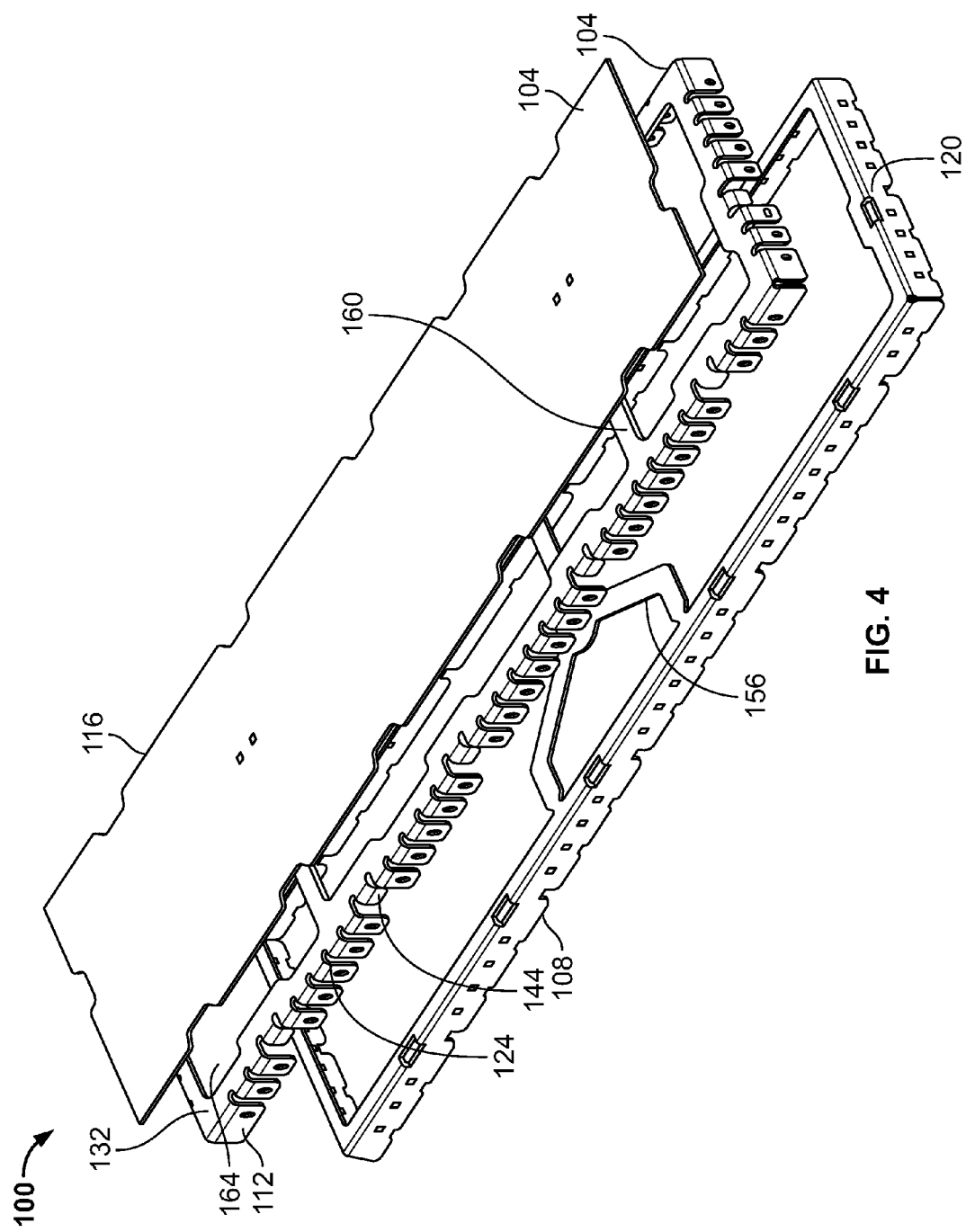
FIG. 4 is an elevated perspective exploded view of the embodiment of the BLS shown in FIG. 1.

FIG. 4 shows an exploded elevated perspective view of the BLS assembly 100 of FIGS. 1 through 3. FIG. 4 highlights the presence of bridges 156, 160, respectively, on the fence 108 and the lid frame 112. The bridges 156 and 160 may be configured to enhance the stability of the BLS components. These bridges 156 and 160 may be removable after installation, similar to those seen in US Patent Application Publication No. US 2013/0033843, assigned to Laird Technologies, Inc. In an exemplary embodiment, the bridge 156 on the fence 108 is removable, while the bridge 160 on the lid frame 112 is non-removable and serves as additional horizontal support for the film or foil cover 116.

FIG. 4 further shows that the cover 116 has been formed, for example by die-cutting, to a shape that complements the various locations of the interior tabs 144 of the lid frame 112. Additionally, the opening 164 defined by the inner edges of the frame rim 132 is not necessarily rectangular, but may include a meandering circumference to provide additional support to the regions of the frame 112 at and/or near the interior tabs 144. Similarly, the fence 108 may include a lip that has been perforated to allow the insertion of the interior tabs 144 of the lid frame 112.

The lid 104 may comprise an aluminum cover 116 and an aluminum frame 112. Alternatively, a variety of other suitable materials may also be used and are embraced by this disclosure. The BLS fence 108 may be any suitable solderable material that aids in providing EMI shielding. The lid frame 112 and cover 116 may be any suitable material(s) that aids in providing EMI shielding.

In contrast to the embodiment seen in FIGS. 1 through 4, FIG. 5 shows an alternate cover-to-frame attachment configuration. In this exemplary embodiment, a film or foil layer or cover 216 is applied to the underside or interior (e.g., concave underside, etc.) of the frame 212 of the lid 204, rather than on top of the frame 112 as seen in FIGS. 1 through 4. The frame 212 of FIG. 5 includes an optional bridge structure 260 to provide some additional support to the cover 216, and to improve structural stability to the frame 212. Similarly, the fence 208 of FIG. 5 includes an optional removable bridge 256 to lend support to the cover 216 and for lending stability to the fence 208.

Figure 5:
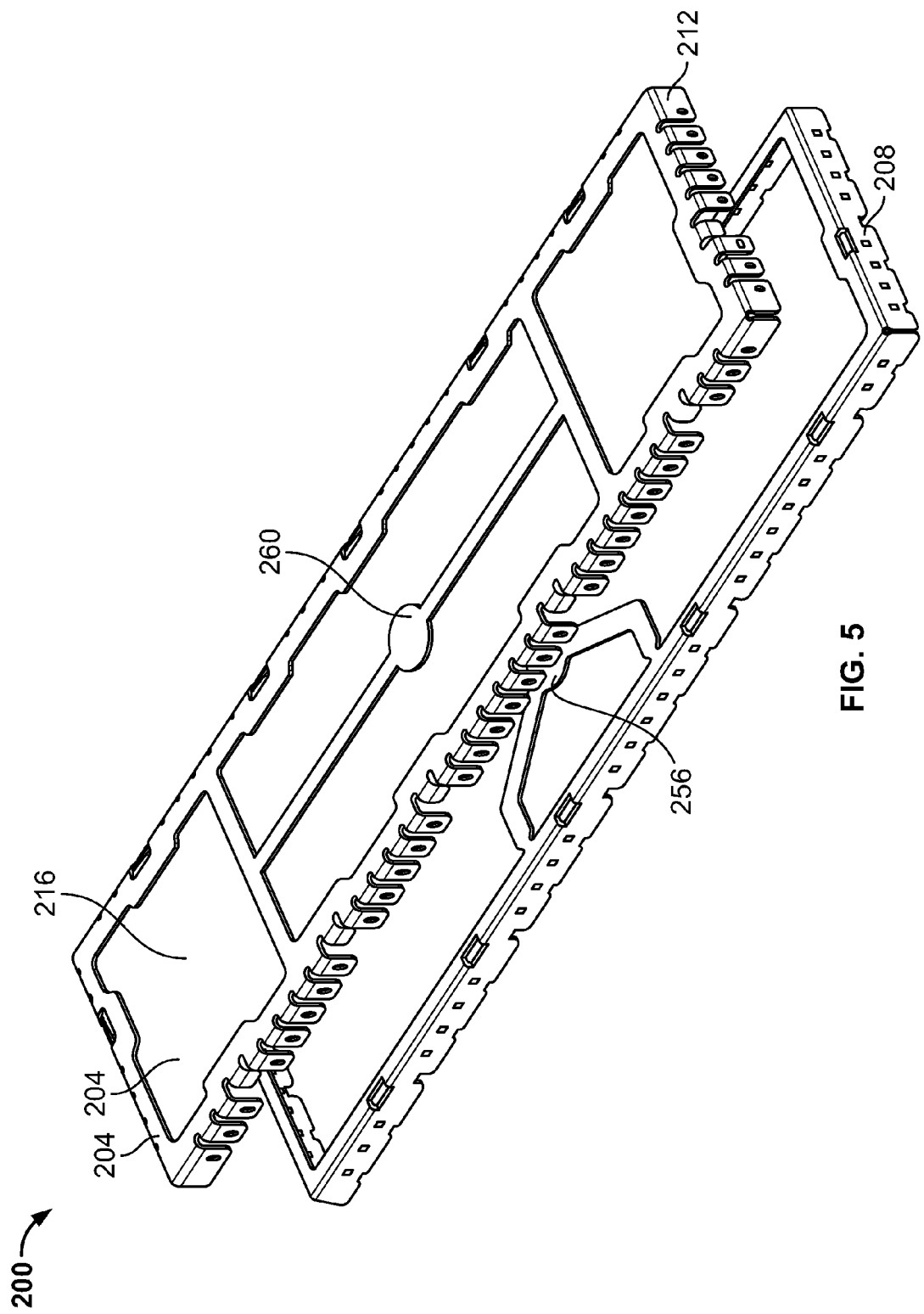
FIG. 5 is an elevated perspective view of another embodiment of a BLS of the disclosure, this figure showing a lid and a fence, where the lid includes a layer of film or foil adhered to the underside of the lid frame.
Figure 6:
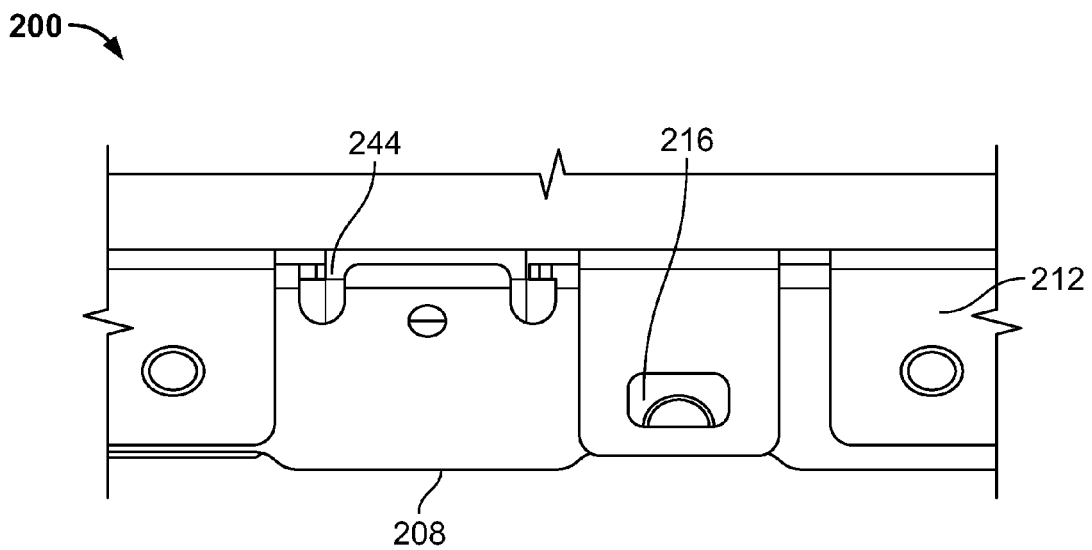
FIG. 6 is a partial side view of the BLS shown in FIG. 5, this figure showing details of embodiments of pressure and locking mechanisms of the lid and fence.
Figure 7:
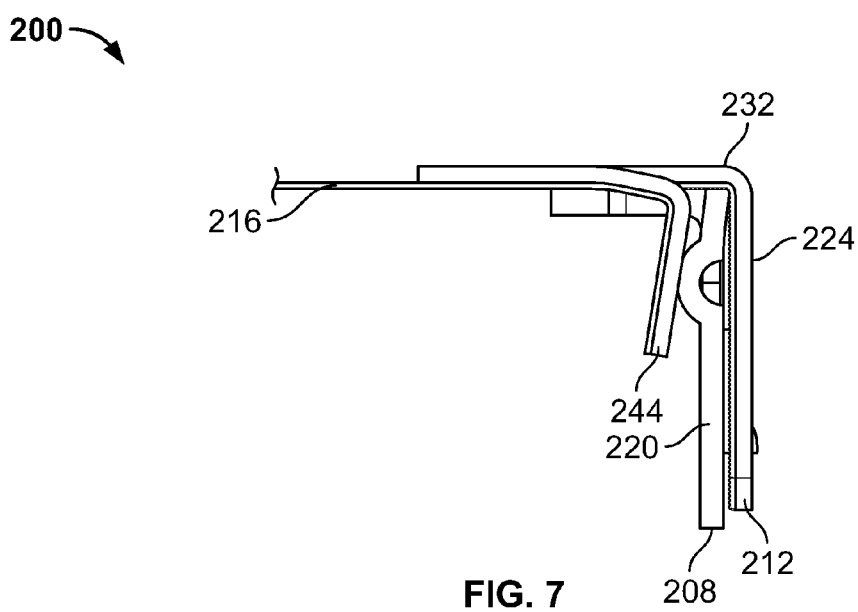
FIG. 7 is a partial cross-sectional view of the BLS shown in FIG. 5, this figure showing details of embodiments of the pressure and locking mechanisms of the lid and fence as seen in FIG. 6.

FIG. 6, analogous to FIG. 3, shows details of the pressure and directional locking features of the BLS 200 shown in FIG. 5. FIG. 7, analogous to FIG. 2, shows a cross-sectional view of the lid 204 having been affixed to the fence 208. In this exemplary embodiment, the cover 216 has been optionally die cut to match the contours of the bent frame 212 through both the sidewalls 224 and the interior tabs 244. With the cover 216 continuing past the underside of the lid frame rim 232 and down the inside surfaces of the lid sidewalls 224, the cover 216 may be tightly and snugly pushed against the fence 208. This, in combination with the pressure and locking mechanisms, improves EMI shielding and conductivity throughout the entire BLS 200. This particular inside film configuration is optional, and embodiments where the cover is die cut to an unfolded substantially planar piece, analogous to that seen in FIGS. 1 through 4, while adhered to the underside of the lid frame, is also embraced by this disclosure.

Figure 8:
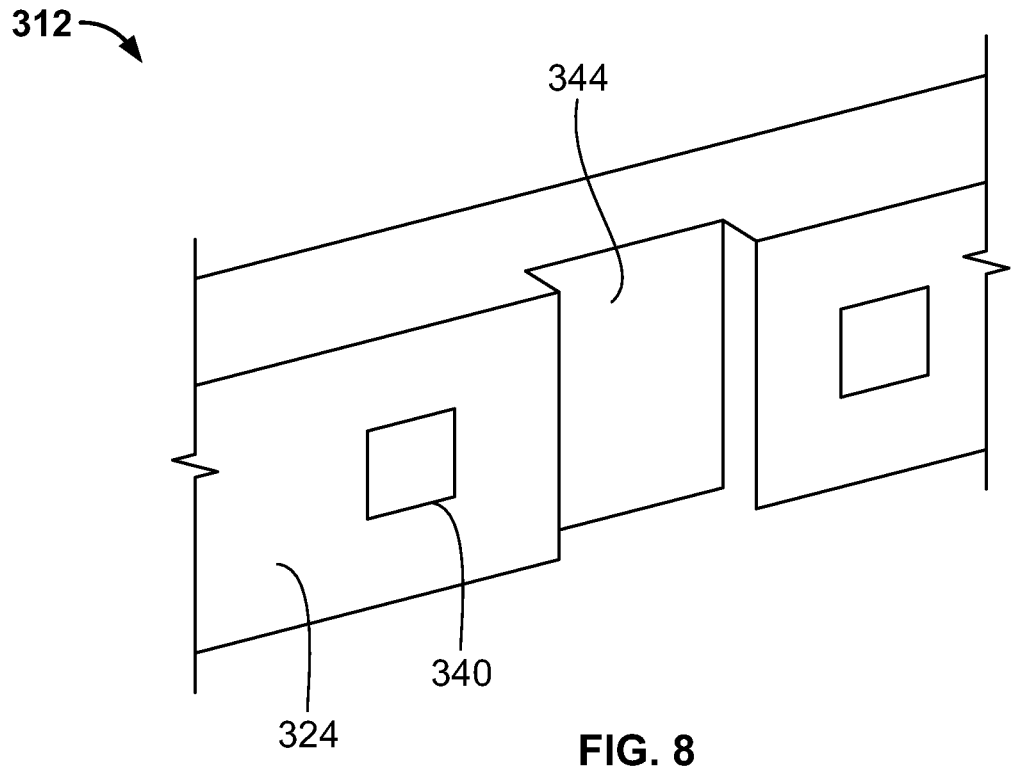
FIG. 8 is a slightly elevated perspective view of a portion of an embodiment of a lid frame, this figure showing the lid frame's sidewall and an interior tab, as well as apertures on the sidewall for accepting a one way directional attachment mechanism.

FIG. 8 shows a portion of an embodiment of the lid frame 312, not mated to a fence. This lid frame 312 includes sidewalls 324 having a series of apertures 340 configured to be complementary in shape to one way directional latching. The lid frame 312 of FIG. 8 further includes an interior tab 344. The interior tab 344 is a downward protrusion of frame sidewall 324 set back some distance towards the interior of the lid frame 312. The interior tab 344 is perpendicular to the remainder of the frame sidewalls 324 in this uninstalled position.

Figure 9:
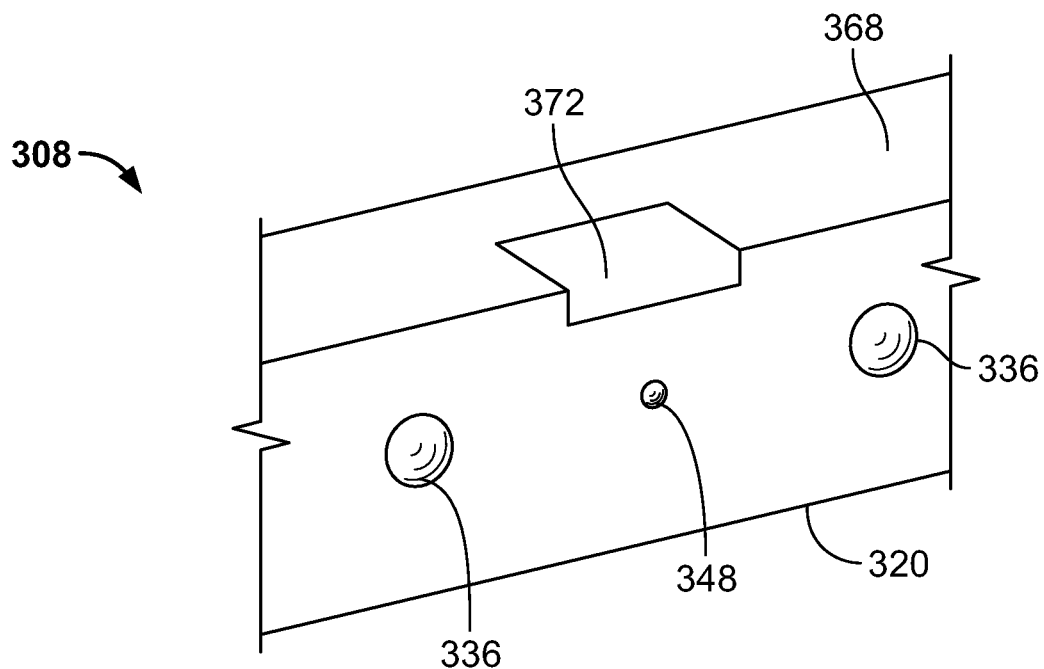
FIG. 9 is a slightly elevated perspective view of a portion of an embodiment of the fence, this figure showing a portion of a fence complementary in arrangement to the lid frame shown in FIG. 8.

FIG. 9 shows a portion of an embodiment of a fence 308 not mated to a lid. The fence 308 includes a perimeter of preferably solderable material that is substantially vertical with respect to a horizontal PCB plane. The fence 308 further includes a lip 368 extending inwardly from and substantially perpendicular to the top of the vertical solderable material.

The portion of the fence 308 seen in FIG. 9 is substantially complementary to the portion of frame 312 seen in FIG. 8. In particular, FIG. 9 shows a pair of protruding quarter sphere-like shapes 336 that may engage the complementary apertures 340 on the frame sidewall 324 of FIG. 8. The lip 368 of the fence 308 (FIG. 9) includes a perforation or opening 372 for accepting the interior tab 344 of the lid frame 312 (FIG. 8). A dimple-like inward protrusion 348 of the fence sidewall 320 can be seen from the exterior of the fence 308 in FIG. 9. The protrusion 348 is generally aligned near the center of the fence 308 below the perforation or opening 372 of the lip 368.

By way of example only, exemplary embodiments disclosed herein may include a frame and/or fence having corner sections with drawn portions that are similar or identical to the frames with corner sections having drawn portions (and/or made by a same or similar manufacturing processes) as disclosed in U.S. Pat. No. 7,488,902. The entire disclosure of U.S. Pat. No. 7,488,902 is incorporated herein by reference. In exemplary embodiments, the shield may have partially drawn and partially formed corner sections for improved rigidity. In an exemplary embodiment, the shield generally includes side walls configured to be disposed generally about one or more electrical components on a substrate. Corner sections are integrally formed with the side walls. Each corner section has a drawn portion integrally connecting a corresponding pair of side walls, and a lower portion located generally below the drawn portion and generally between side edge portions of the corresponding pair of side walls.

The fence or lid may both be generally rectangular. Alternative embodiments can include a fence and/or a lid having more or less than four peripheral walls and/or peripheral walls in other rectangular configurations or non-rectangular configurations (e.g., triangular, hexagonal, circular, other polygonal shapes, other rectangular configurations than what is shown in figures, etc.). Further embodiments can include peripheral walls having more or less openings and/or more or less detents than what are disclosed in the figures. Other embodiments may include a plurality of separate, discrete sidewalls that are individually soldered to the PCB.

In various embodiments, the fence may be integrally or monolithically formed as a single component. The fence can be formed by stamping in a piece of material a flat profile pattern for the fence. After stamping the flat pattern profile for the fence into the piece of material, the wall portions may then be folded or bent generally perpendicular. Even though the fence may be formed integrally in this example, such is not required for all embodiments. For example, other embodiments of the fence may include tabs or wall portions that are discrete components separately attached to the fence, for example, by welding, adhesives, among other suitable methods. Alternative configurations (e.g., shapes, sizes, etc.), materials, and manufacturing methods (e.g., drawing, etc.) can be used for making the fence.

A wide range of materials can be used for the fence, which materials are preferably suitably solderable for surface mount technology reflow operations. Exemplary materials that can be used for the fence include nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, combinations thereof, among other suitable electrically conductive materials. The assembly and components thereof can be configured from different materials and/or with different dimensions depending, for example, on the particular application, such as the component to be shielded, space considerations within the overall apparatus, EMI shielding and heat dissipation needs, and other factors.

The lid frame may be integrally or monolithically formed as a single component. The lid frame can be formed by stamping in a piece of material a flat profile pattern for the lid frame. After stamping the flat pattern profile for the lid frame into the piece of material, the wall portions may then be folded or bent generally perpendicular. Even though the lid frame can be formed integrally in this example, such is not required for all embodiments. For example, other embodiments may include one or more discrete components separately attached to the lid, for example, by welding, adhesives, among other suitable methods. Alternative configurations (e.g., shapes, sizes, etc.), materials, and manufacturing methods (e.g., drawing, etc.) can be used for making the lid.

A wide range of materials can be used for the lid or, where the lid includes a frame and cover, the frame, such as nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, combinations thereof, among other suitable electrically conductive materials. The assembly and components thereof can be configured from different materials and/or with different dimensions depending, for example, on the particular application, such as the component to be shielded, space considerations within the overall apparatus, EMI shielding and heat dissipation needs, and other factors.

Accordingly, exemplary embodiments of board level shield (BLS) assemblies for electromagnetic interference mitigation are disclosed. In exemplary embodiments, the BLS assembly includes a fence and a lid. The fence may include a perimeter of solderable material of substantially uniform height. The lid may include a planar surface of material having sidewalls descending from the planar surface to form an interior region (e.g., concave underside, etc.). The lid may be complementary in shape to the fence such that the lid may be attachable to the fence such that the lid sidewalls at least partially cover the perimeter of the fence. The lid may further include at least one interior tab. The interior tab is a downward protrusion from the lid substantially parallel to the lid sidewalls. The interior tab may be positioned inward or towards the interior region of the lid away from the lid sidewalls by a distance substantially equal to a thickness of the fence. The lid and fence together may include a latching mechanism for attachment of the lid to the fence. The fence may further include at least one inward protrusion positioned such that, when the lid is attached to the fence via the latching mechanism, the at least one inward protrusion pushes the at least one interior tab at least slightly towards the interior region of the lid.

The lid may include a frame and a cover. The frame may include a perimeter rim extending inwardly from the top of the sidewalls of the frame. The rim may be substantially perpendicular to the frame's sidewalls. The rim may have inner edges to define a frame interior. The cover may be a substantially horizontal portion of material (e.g., foil, film, etc.) affixed to the frame's rim to overspread the frame interior.

The cover may be composed of a material selected from the group consisting of metal foil, reinforced foil, electrically-conductive film, metallized polyimide film, and metal plated polyimide film. The fence may be composed of a material selected from the group consisting of nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, and any combination thereof.

The interior region of the lid defines the underside of the lid. The cover may be affixed to the underside of the rim. The lid may include a plurality of interior tabs, and the fence may comprises a plurality of inward protrusions.

The latching mechanism may be a plurality of one way directional latching mechanisms. The one way directional latching mechanisms may be a series of protruding quarter sphere-like shapes on the fence and a series of complementary apertures on the frame sidewalls. The lid may include a series of interior tabs, and the fence may further include a lip. The lip of the fence may extend inwardly from and substantially perpendicular to the top of the fence. The lip of the fence may include a series of perforations for accepting the interior tabs. The fence may further include a series of inward protrusions.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A board level shield (BLS) assembly for electromagnetic interference mitigation comprising a fence and a lid, wherein:
   the lid comprises a planar surface of material having sidewalls descending from the planar surface to form an interior region, and the lid is complementary in shape to the fence such that the lid is attachable to the fence such that the sidewalls of the lid at least partially cover a perimeter of the fence;
   the lid further comprises at least one interior tab positioned towards the interior region of the lid away from the sidewalls of the lid by a distance substantially equal to a thickness of the fence;
   the lid and fence together include a latching mechanism for attachment of the lid to the fence; and
   the fence further includes at least one inward protrusion positioned such that, when the lid is attached to the fence via the latching mechanism, the at least one inward protrusion of the fence pushes the at least one interior tab of the lid at least slightly towards the interior region of the lid;
   wherein:
   the lid comprises a frame and a cover;
   the frame comprises a perimeter rim extending inwardly from a top of the frame;
   the perimeter rim includes inner edges that define an open top of the frame; and
   the cover comprises a substantially horizontal portion of material affixed to the perimeter rim to cover the open top of the frame.

2. The BLS assembly of claim 1, wherein the fence and the lid are configured such that the at least one inward protrusion of the fence forces the at least one interior tab of the lid to at least partially bend inward when the lid is attached to the fence via the latching mechanism, thereby providing positive pressure for electrical contact between the lid and the fence.

3. The BLS assembly of claim 1, wherein the cover is composed of a material selected from the group consisting of metal foil, reinforced foil, electrically-conductive film, metallized polyimide film, and metal plated polyimide film.

4. The BLS assembly of claim 1, wherein the fence is composed of a material selected from the group consisting of nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, and any combination thereof.

5. The BLS assembly of claim 1, wherein:
the cover is composed of a material selected from the group consisting of metal foil, reinforced foil, electrically-conductive film, metallized polyimide film, and metal plated polyimide film; and
the fence is composed of a material selected from the group consisting of nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, and any combination thereof.

6. The BLS assembly of claim 1, wherein the cover is affixed to an underside of the perimeter rim of the frame.

7. The BLS assembly of claim 1, wherein:
the at least one interior tab of the lid comprises a plurality of interior tabs; and
the at least one inward protrusion of the fence comprises a plurality of inward protrusions.

8. The BLS assembly of claim 1, wherein the latching mechanism comprises a plurality of one way directional latching mechanisms.

9. The BLS assembly of claim 8, wherein the plurality of one way directional latching mechanisms comprise a series of protruding quarter spherical shapes along the fence and a series of complementary apertures along the sidewalls of the lid.

10. The BLS assembly of claim 1, wherein:
the fence comprises a perimeter of solderable material of substantially uniform height; and/or
the interior tab is a downward protrusion from the lid substantially parallel to the sidewalls of the lid.

11. A board level shield (BLS) assembly for electromagnetic interference mitigation comprising:
a fence;
a lid including a frame and a cover attached to the frame, the lid is attachable to the fence via a latching mechanism such that the lid at least partially covers a perimeter of the fence;
the frame comprises at least one interior tab positioned inwardly towards an interior region of the frame; and
the fence includes at least one inward protrusion positioned such that, when the lid is attached to the fence via the latching mechanism, the at least one inward protrusion of the fence pushes the at least one interior tab of the frame at least slightly towards the interior region of the frame;
wherein:
the frame comprises a perimeter rim extending inwardly from a top of the frame;
the perimeter rim includes inner edges that define an open top of the frame; and
the cover comprises a substantially horizontal portion of material affixed to the perimeter rim to cover the open top of the frame.

12. The BLS assembly of claim 11, wherein the fence and the lid are configured such that the at least one inward protrusion of the fence forces the at least one interior tab of the frame to at least partially bend inward when the lid is attached to the fence via the latching mechanism, thereby providing positive pressure for electrical contact between the lid and the fence.

13. The BLS assembly of claim 11, wherein the at least one interior tab of the frame is positioned inwardly towards the interior region and away from a corresponding side of the frame by a distance substantially equal to a thickness of the fence.

14. The BLS assembly of claim 11, wherein:
the cover is composed of a material selected from the group consisting of metal foil, reinforced foil, electrically-conductive film, metallized polyimide film, and metal plated polyimide film; and/or
the fence is composed of a material selected from the group consisting of nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, and any combination thereof.

15. The BLS assembly of claim 11, wherein the cover is affixed to an underside of the perimeter rim of the frame.

16. The BLS assembly of claim 11, wherein:
the at least one interior tab of the frame comprises a plurality of interior tabs; and
the at least one inward protrusion of the fence comprises a plurality of inward protrusions.

17. The BLS assembly of claim 11 wherein the latching mechanism comprises a plurality of one way directional latching mechanisms.

18. The BLS assembly of claim 17, wherein the plurality of one way directional latching mechanisms comprises a series of protruding quarter spherical shapes along sidewalls of the fence and a series of complementary apertures along sidewalls of the frame.

* * * * *